United States Patent
Walsh et al.

(10) Patent No.: US 9,810,718 B2
(45) Date of Patent: Nov. 7, 2017

(54) WIRE WOUND RESISTOR ARRANGEMENT AND SENSING ARRANGEMENT INCLUDING THE SAME

(71) Applicant: EATON CORPORATION, Cleveland, OH (US)

(72) Inventors: Patrick Thomas Walsh, Coraopolis, PA (US); Theodore James Miller, Oakdale, PA (US)

(73) Assignee: EATON CORPORATION, Cleveland, OH (US)

( * ) Notice: Subject to any disclaimer, the term of this patent is extended or adjusted under 35 U.S.C. 154(b) by 0 days.

(21) Appl. No.: 14/657,264

(22) Filed: Mar. 13, 2015

(65) Prior Publication Data
US 2016/0266171 A1   Sep. 15, 2016

(51) Int. Cl.
*G01R 15/18* (2006.01)
*H01C 1/14* (2006.01)
*H01C 3/14* (2006.01)
*G01R 19/10* (2006.01)

(52) U.S. Cl.
CPC ............ *G01R 15/181* (2013.01); *H01C 1/14* (2013.01); *H01C 3/14* (2013.01); *G01R 19/10* (2013.01)

(58) Field of Classification Search
CPC ........ G01R 1/22; G01R 15/18; G01R 15/183; G01R 31/025; G01R 31/08; G01R 31/088; G01R 31/085; G01R 31/024; G01R 31/021; G01R 33/12; G01R 33/1223; G01R 27/205; G01P 3/665; G01N 27/72; G01N 27/023; G01N 27/9046
USPC ............... 324/522, 179, 239, 234, 525, 127
See application file for complete search history.

(56) References Cited

U.S. PATENT DOCUMENTS

| | | | | |
|---|---|---|---|---|
| 4,096,424 A * | 6/1978 | Hysler | ................. | G05D 7/0605 250/223 R |
| 4,728,888 A * | 3/1988 | Bauer | .................... | G01R 33/04 324/253 |
| 5,596,309 A * | 1/1997 | Nabeshima | .............. | H01C 3/02 338/214 |
| 5,757,629 A * | 5/1998 | Yntema | .............. | H02M 3/1563 363/131 |
| 6,094,043 A * | 7/2000 | Scott | .................... | G01R 15/181 324/117 R |
| 6,318,171 B1 * | 11/2001 | Suzuki | ................. | G01F 1/6845 73/204.27 |

(Continued)

FOREIGN PATENT DOCUMENTS

JP   2003158001   *   5/2003

OTHER PUBLICATIONS

Resistor Guide, "Wirewound resistor", http://www.resistorguide.com/wirewound-resistor/, 4 pp., 2015.

*Primary Examiner* — Thang Le
(74) *Attorney, Agent, or Firm* — Eckert Seamans; Nathaniel C. Wilks; Grant E. Coffield

(57) ABSTRACT

A wire wound resistor arrangement including a plurality of wire wound resistors electrically connected in a series connection, a first terminal disposed at a first end of the series connection of wire wound resistors, and a second terminal disposed at a second end of the series connection of wire wound resistors. The wire wound resistors are arranged in a polygonal shape having at least three vertices the first terminal and the second terminal are disposed at one of the vertices.

20 Claims, 4 Drawing Sheets

(56) References Cited

U.S. PATENT DOCUMENTS

| | | | | |
|---|---|---|---|---|
| 6,651,020 B2* | 11/2003 | More | H03M 1/1038 | 323/367 |
| 7,078,888 B2* | 7/2006 | Budillon | G01R 15/181 | 324/117 H |
| 9,354,258 B2* | 5/2016 | Ryochi | G01R 19/00 | |
| 2006/0038552 A1* | 2/2006 | Omura | G01R 19/0092 | 324/117 R |
| 2007/0108987 A1* | 5/2007 | Satou | G01R 15/183 | 324/522 |
| 2014/0111190 A1* | 4/2014 | Ryochi | G01R 19/00 | 324/127 |

* cited by examiner

WIRE WOUND RESISTOR ARRANGEMENT AND SENSING ARRANGEMENT INCLUDING THE SAME

BACKGROUND

Field

The disclosed concept relates generally to wire wound resistors, and more particularly to wire wound resistor arrangements. The disclosed concept also relates to sensing arrangements including wire wound resistor arrangements.

Background Information

In power distribution systems, equipment associated therewith, or any other type of system or device that uses electricity, there may be a need to sense current and/or voltage flowing through conductors in the system. There are various types of devices currently used to sense current such as current transformers and Rogowski coils. However, each of these devices has their own limitations or drawbacks. For instance, current transformers are susceptible to saturation at higher currents. Although Rogowski coils can overcome the saturation effect, both current transformers and Rogowski coils can be costly.

Moreover, while current transformers and Rogowski coils can be used to sense current, they are not use to sense voltage. In applications where both current and voltage are to be sensed, a voltage sensor is used in addition to a current transformer or Rogowski coil, thus adding cost. Reducing the cost associated with sensing current and/or voltage would be desirable.

There is room for improvement in devices for sensing current and/or voltage in conductors.

SUMMARY

These needs and others are met by embodiments of the disclosed concept, which are directed to a wire wound resistor arrangement having a polygonal shape with at least three vertices.

In accordance with aspects of the disclosed concept, a wire wound resistor arrangement comprises: a plurality of wire wound resistors electrically connected in a series connection; a first terminal disposed at a first end of the series connection of wire wound resistors; and a second terminal disposed at a second end of the series connection of wire wound resistors, wherein the wire wound resistors are arranged in a polygonal shape having at least three vertices, and wherein the first terminal and the second terminal are disposed at one of the vertices.

In accordance with other aspects of the disclosed concept, a sensing arrangement structured to sense current or voltage of at least one conductor comprises: at least one wire wound resistor arrangement comprising: a plurality of wire wound resistors electrically connected in a series connection; a first terminal disposed at a first end of the series connection of wire wound resistors; and a second terminal disposed at a second end of the series connection of wire wound resistors, wherein the wire wound resistors are arranged in a polygonal shape having at least three vertices, and wherein the first terminal and the second terminal are disposed at one of the vertices; and a measurement unit electrically connected to at least one of the first and second terminals of said at least one wire wound resistor arrangement, wherein the wire wound resistor arrangement is structured to allow the conductor to pass through an interior of the polygonal shape, and wherein the measurement unit is structured to determine the current or voltage of the conductor based on an output of at least one of the first and second terminals of said at least one wire wound resistor arrangement.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1A:
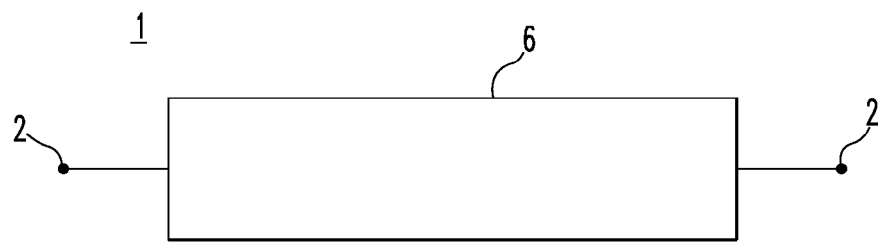
FIG. 1A is a front view of a wire wound resistor in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall mean one or an integer greater than one (i.e., a plurality).

As employed herein, the term "processor" shall mean a programmable analog and/or digital device that can store, retrieve, and process data (e.g., without limitation, a computer; a workstation; a personal computer; a controller; a digital signal processor; a microprocessor; a microcontroller; a microcomputer; a central processing unit; a mainframe computer; a mini-computer; a server; a networked processor; a programmable logic controller; or any suitable processing device or apparatus).

Figure 1B:
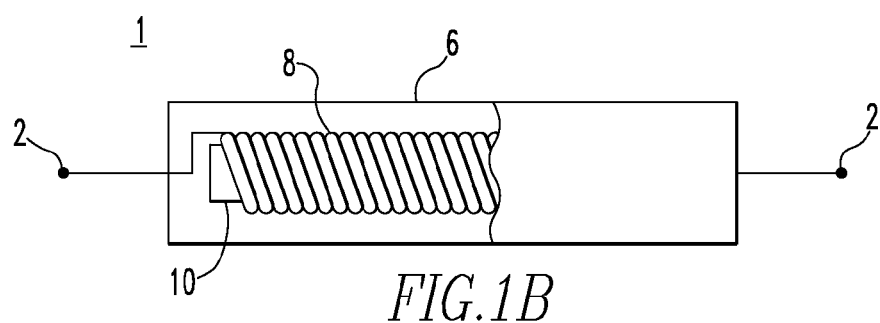
FIG. 1B is a partial cross-sectional view of the wire wound resistor of FIG. 1A.

FIG. 1A is a front view of a wire wound resistor 1 in accordance with an example embodiment of the disclosed concept and FIG. 1B is a partial cross-sectional view of the wire wound resistor 1 of FIG. 1A.

The wire wound resistor 1 includes terminals 2 and a casing 6. Inside the casing 6, a wire 8 is wound around a core 10. The terminals 2 are electrically connected to respective ends of the wire 8. It is contemplated that the wire 8 may be electrically connected to the terminals 2 via caps, rings, or other suitable connection mechanisms disposed at the ends of the core 10.

The casing 6 may be composed of any suitable non-conductive material such as, without limitation, ceramic. The wire 8 may be composed of any suitable metallic material such as, without limitation, copper alloys, silver alloys, nickel chromium alloys, iron chromium allows, or iron chromium aluminum alloys. The core 10 may be composed of any suitable non-conductive material such as, without limitation, ceramic, plastic, and glass.

In the wire wound resistor 1, the wire 8 is wound around the core in a normal coil winding (as shown in FIG. 1B). While wire wound resistors may employ other types of windings such as a bifilar winding or an Ayrton-Perry winding, bifilar or Ayrton-Perry windings are intended to reduce the inductance of wire wound resistors. In the presently disclosed concept, inductance in the wire wound resistor 1 is desirable, and thus employing a normal coil winding in the wire wound resistor 1 is preferable over other types of windings such as bifilar or Ayrton-Perry windings.

Figure 2:
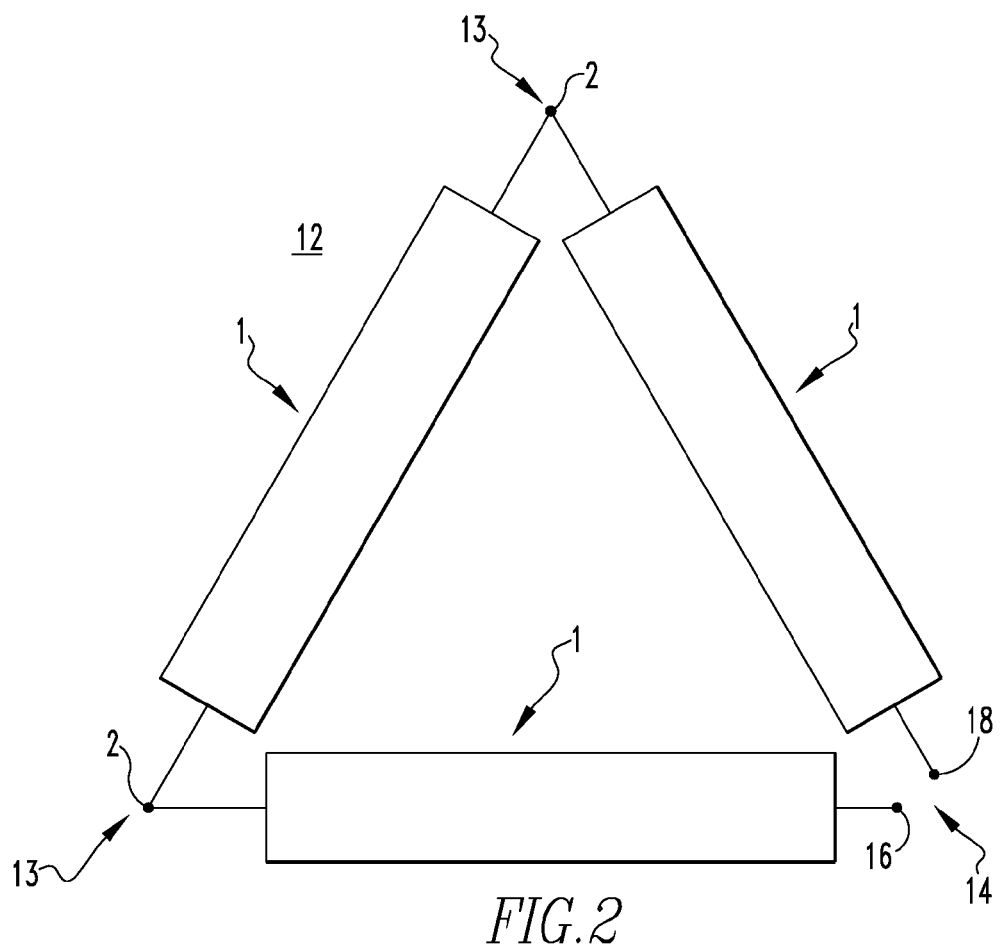
FIG. 2 is a front view of a wire wound resistor arrangement in accordance with an example embodiment of the disclosed concept.

FIG. 2 is a front view of a wire wound resistor arrangement 12 in accordance with an example embodiment of the disclosed concept. The wire wound resistor arrangement 12 includes three wire wound resistors 1 arranged in a triangular shape.

The triangular shape has three vertices 13,14. Two of the vertices are connected vertices 13 in which terminals 2 of adjacent wire wound resistors 1 are electrically connected to each other. The third vertex is an unconnected vertex 14 in which terminals 2 of adjacent wire wound resistors 1 are not electrically connected to each other. The wire wound resistors 1 are thus electrically connected in series with each other and the terminals 2 at the third vertex 14 are the ends of the series connection. The terminals 2 at the third vertex 14 serve as an input terminal 16 and an output terminal 18 of the wire wound resistor arrangement 12.

Figure 3:
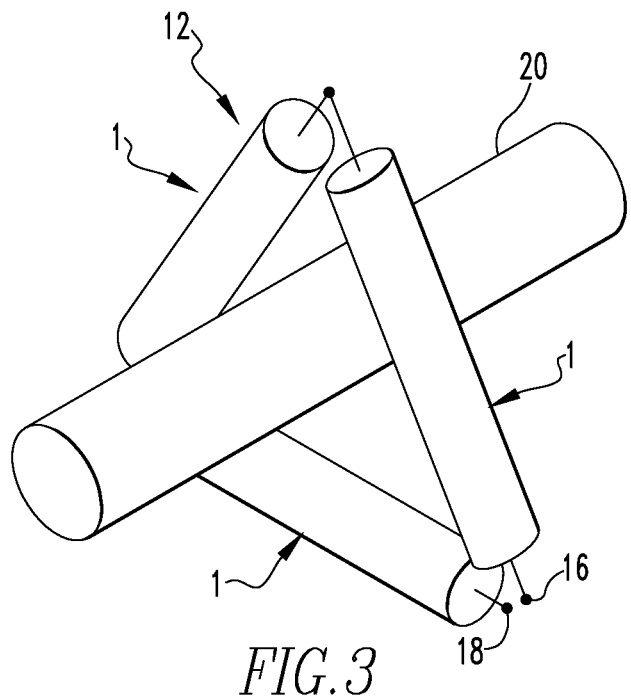
FIG. 3 is an isometric view of the wire wound resistor arrangement of FIG. 2 arranged around a conductor.

FIG. 3 is an isometric view of the wire wound resistor arrangement 12 arranged around a conductor 20. As shown in FIG. 3, the conductor 20 passes through an interior of the triangular shape formed by the wire wound resistor arrangement 12. As previously noted, the wire wound resistors 1 include wire 8 wound around a core 10. A magnetic field created by current flowing through the conductor 20 will thus induce a current in the wire wound resistor arrangement 12. Measurement equipment may be electrically connected to the input and output terminals 16,18 of the wire wound resistor arrangement 12 to detect the current induced in it.

The current in the wire wound resistor arrangement 12 is proportional to the current flowing through the conductor 20. Thus, the current detected at the terminals 16,18 may be used to determine the amount of current flowing through the conductor 20. In order to determine the amount of current flowing through the conductor 20 a degree of precision may be required in the wire wound resistor arrangement 12 and/or the measurement equipment used to detect the current flowing in the wire wound resistor arrangement 12. However, in some example embodiments of the disclosed concept, the wire wound resistor arrangement 12 may be employed to detect only the presence or absence of current flowing through the conductor 20, rather than the amount of current flowing through the conductor 20. In this case, less precision is needed in the wire wound resistor arrangement 12 or associated measurement equipment. In either case, the wire wound resistor arrangement 12 has a low cost compared to other current sensors such as current transformers or Rogowski coils. Moreover, like a Rogowski coil, the wire wound resistors 1 do not saturate, and thus can be employed to sense high levels of current.

The wire wound resistors 1 in the wire wound resistor arrangement 12 may have any suitable resistance value. In one example embodiment of the disclosed concept, the wire wound resistors 1 each have a resistance of, without limitation, about 330 kΩ. In some other example embodiments of the disclosed concept, the wire wound resistors 1 each have a resistance of, without limitation, about 7 kΩ or about 700 kΩ.

Figure 4:
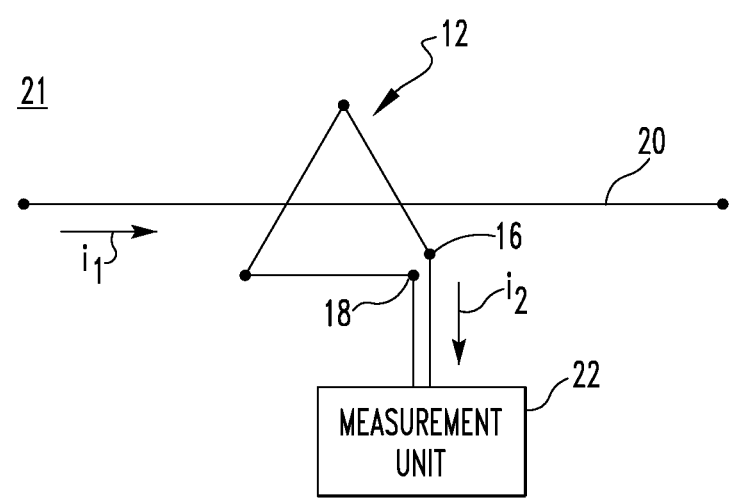
FIG. 4 is a schematic diagram of a current sensing arrangement in accordance with an example embodiment of the disclosed concept.

FIG. 4 is a schematic diagram of a current sensing arrangement 21 in accordance with an example embodiment of the disclosed concept. The current sensing arrangement 21 includes the wire wound resistor arrangement 12 employed in conjunction with a measurement unit 22. As shown in FIG. 4, the conductor 20 passes through the interior of the triangular shape of the wire wound resistor arrangement 12. The measurement unit 22 is electrically connected to the input and output terminals 16,18 of the wire wound resistor arrangement. A current $i_1$ flowing through the conductor 20 induces a current $i_2$ in the wire wound resistor arrangement 12. The measurement unit 22 is structured to detect the current $i_2$ in the wire wound resistor arrangement 12. In some example embodiments of the disclosed concept, the measurement unit 22 is structured to determine the amount of the current $i_1$ flowing in the conductor 20 based on the current i2 in the wire wound resistor 12 arrangement. In some other example embodiments of the disclosed concept, the measurement unit 22 is structured to determine whether current is present in the conductor 20 based on the current $i_2$ in the wire wound resistor arrangement 12, but is not structured to determine the amount of the current $i_1$ flowing through the conductor 20.

The measurement unit 22 may be any suitable circuit such as without limitation, an analog or digital circuit. It is contemplated that the measurement unit may also include a processor and/or a memory. The processor may be, for example and without limitation, a microprocessor, a microcontroller, or some other suitable processing device or circuitry, that interfaces with the memory. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory.

Figure 5:
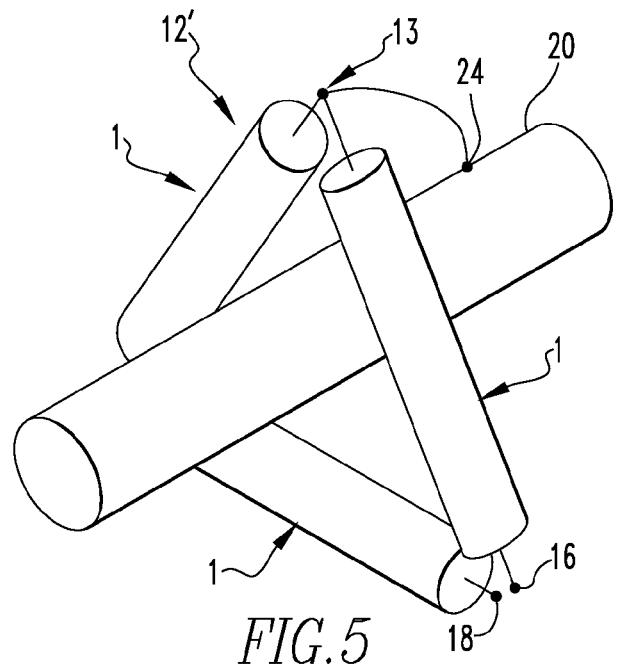
FIG. 5 is an isometric view of a wire wound resistor arrangement arranged around a conductor in accordance with another example embodiment of the disclosed concept.

FIG. 5 is an isometric view of a wire wound resistor arrangement 12' in accordance with another example embodiment of the disclosed concept. The wire wound resistor arrangement 12' of FIG. 5 is similar to the wire wound resistor arrangement 12' of FIG. 3. However, in the wire wound arrangement 12' of FIG. 5, one of the connected vertices 13 of the wire wound resistor arrangement 12' is electrically connected to a point 24 on the conductor 20.

When one of the connected vertices 13 of the wire wound resistor arrangement 12' is electrically connected to the point 24 (or another point) on the conductor 20, the voltage level of the conductor 20 can be sensed by measurement equipment electrically connected to the output terminal 18 of the wire wound resistor arrangement 12'. Furthermore, the conductor 20 also induces current in the wire wound resistor arrangement 12', and thus the current flowing through the conductor 20 can also be determined with measurement equipment electrically connected to the output terminal 18 of the wire wound resistor arrangement 12'.

Figure 6:
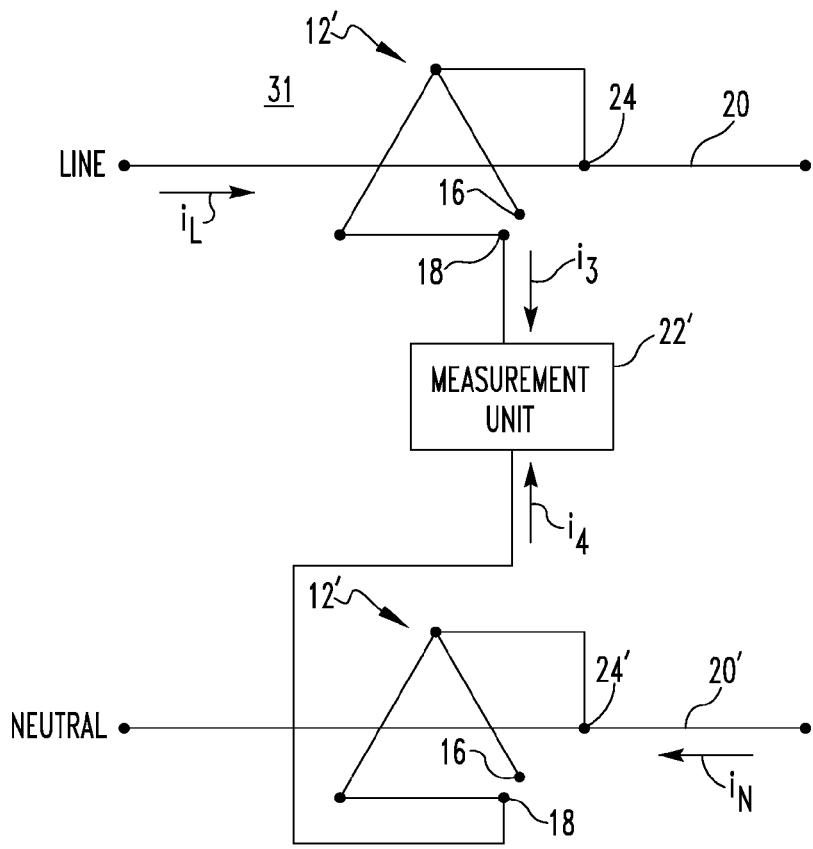
FIG. 6 is a schematic diagram of a current and voltage sensing arrangement in accordance with another example embodiment of the disclosed concept.

FIG. 6 is a schematic diagram of a current and voltage sensing arrangement 31 in accordance with an example embodiment of the disclosed concept. The current and voltage sensing arrangement 31 includes two wire wound resistor arrangements 12'. A first one of the wire wound resistor arrangements 12' is arranged so that a first conductor 20 passes through the interior of its triangular shape. The second one of the wire wound resistor arrangements 12' is arranged so that a second conductor 20' passes through the interior of its triangular shape. It is contemplated that the first and second conductors may be LINE and NEUTRAL conductors, respectively.

One of the connected vertices 13 of each of the wire wound resistor arrangements 12' is electrically connected to points 24,24' on their corresponding conductors 20,20'. The output terminals 18 of the wire wound resistor arrangements 12' are electrically connected to a measurement unit 22'.

The measurement unit 22' is structured to determine the currents $i_L, i_N$ flowing through the respective conductors 20,20' based on the currents $i_3, i_4$ induced in the wire wound resistor arrangements 12'. In some embodiments of the disclosed concept, the measurement unit 22' is structured to determine the amounts of the currents $i_L, i_N$ flowing through the respective conductors 20,20', whereas in some other embodiments of the disclosed concept, the measurement unit 22' is structured to determine the presence or absence of current in the conductors 20,20' without determining the amounts of the currents $i_L, i_N$ flowing through the conductors.

The measurement unit 22' is also structured to determine the voltage difference between the conductors 20,20' based on the currents $i_3, i_4$ in the wire wound resistor arrangements 12'. The measurement unit 22' is able to determine both the voltage difference between the conductors 20,20' and the currents $i_L, i_N$ flowing through the conductors 20,20' simultaneously because the voltage is relative to a potential difference between the conductors and the currents $i_L, i_N$ are relative to the changing magnetic fields that the currents $i_L, i_N$ generate. By utilizing the wire wound resistor arrangements 12' for the dual purposes of current and voltage sensing, the cost of providing current and voltage sensing is lower compared with other arrangements such as those employing current transformers or Rogowski coils along with an additional voltage sensor.

It is contemplated that in some example embodiments of the disclosed concept, any selected one of the connected vertices 13 or the input terminal 16 of the wire wound resistor arrangement 12' may be electrically connected to conductor 20 without departing from the scope of the disclosed concept.

It is contemplated that the input and output terminals 16,18 of the wire wound resistor arrangements 12,12' may be interchanged without departing from the scope of the disclosed concept.

Figure 7A:
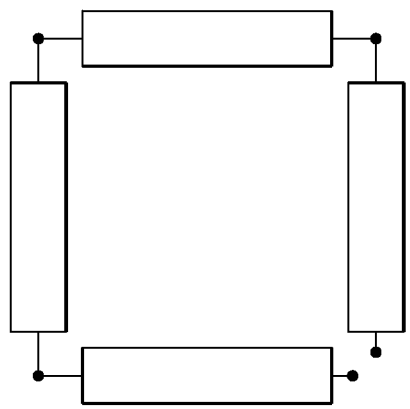
FIGS. 7A and 7B are front views of wire wound resistor arrangements in accordance with other example embodiments of the disclosed concept.
Figure 7B:
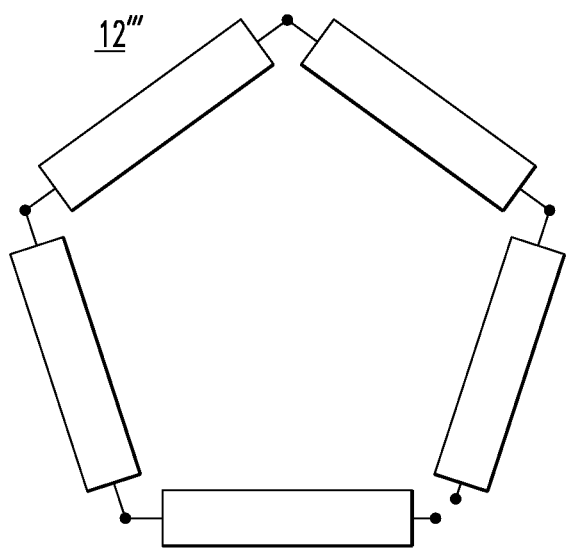

While triangular shaped wire wound resistor arrangements 12,12' are disclosed, it is contemplated that the wire wound resistor arrangements 12,12' may include additional wire wound resistors 1 and have other shapes such as, without limitation, a square, such as the wire wound resistor arrangement 12" shown in FIG. 7A, a hexagon, such as the wire wound resistor arrangement 12''' shown in FIG. 7B. It is contemplated that the wire wound resistor arrangements having any polygonal shape with at least three vertices may be employed without departing from the scope of the disclosed concept. The input and output terminals 16,18 are disposed at a common vertex of the polygonal shape, regardless of the number of vertices.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A sensing arrangement structured to sense current or voltage of at least one conductor, the sensing arrangement comprising:
    a plurality of wire wound resistors electrically connected in a series connection;
    a first terminal disposed at a first end of the series connection of wire wound resistors; and
    a second terminal disposed at a second end of the series connection of wire wound resistors, wherein the wire wound resistors are arranged in a polygonal shape having at least three vertices, and wherein the first terminal and the second terminal are disposed at one of the vertices,
    wherein each of the wire wound resistors has a resistance of at least 7 kΩ.

2. The sensing arrangement of claim 1, wherein the polygonal shape is a triangle.

3. The sensing arrangement of claim 1, wherein the polygonal shape is at least one of a square and a hexagon.

4. The sensing arrangement of claim 1, wherein each of the wire wound resistors includes a core and a wire wound around the core.

5. The sensing arrangement of claim 4, wherein the wire is composed of at least one of copper alloys, silver alloys, nickel chromium alloys, iron chromium allows, and iron chromium aluminum alloys; and wherein the core is composed of at least one of ceramic, plastic, and glass.

6. The sensing arrangement of claim 4, wherein the wire is wound around the core in a normal coil winding.

7. A sensing arrangement structured to sense current or voltage of at least one conductor, the sensing arrangement comprising:
    at least one wire wound resistor arrangement comprising:
        a plurality of wire wound resistors electrically connected in a series connection;
        a first terminal disposed at a first end of the series connection of wire wound resistors; and
        a second terminal disposed at a second end of the series connection of wire wound resistors,
        wherein the wire wound resistors are arranged in a polygonal shape having at least three vertices, and
        wherein the first terminal and the second terminal are disposed at one of the vertices; and
    a measurement unit electrically connected to at least one of the first and second terminals of said at least one wire wound resistor arrangement, and
    wherein the wire wound resistor arrangement is structured to allow the conductor to pass through an interior of the polygonal shape,
    wherein the measurement unit is structured to determine the current or voltage of the conductor based on an output of at least one of the first and second terminals of said at least one wire wound resistor arrangement,
    wherein each of the wire wound resistors has a resistance of at least 7 kΩ.

8. The sensing arrangement of claim 7, wherein the at least one conductor is one conductor; wherein the at least one wire wound resistor arrangement is one wire wound resistor arrangement; wherein the measurement unit is electrically connected to the first and second terminals of the one wire wound resistor arrangement; and wherein the measurement unit is structured to determine the current in the conductor based on an output at the first and second terminals of the one wire wound resistor arrangement.

9. The sensing arrangement of claim 7, wherein the measurement unit is structured to determine an amount of current flowing through the at least one conductor.

10. The sensing arrangement of claim 7, wherein the measurement unit is structured to determine a presence or absence of current flowing through the at least one conductor without sensing an amount of current flowing through the at least one conductor.

11. The sensing arrangement of claim 7, wherein the polygonal shape is a triangle.

12. The sensing arrangement of claim 7, wherein the polygonal shape is at least one of a square and a hexagon.

13. The sensing arrangement of claim 7, wherein each of the wire wound resistors includes a core and a wire wound around the core.

14. The sensing arrangement of claim 13, wherein the wire is composed of at least one of copper alloys, silver alloys, nickel chromium alloys, iron chromium allows, and iron chromium aluminum alloys; and wherein the core is composed of at least one of ceramic, plastic, and glass.

15. The sensing arrangement of claim 13, wherein the wire is wound around the core in a normal coil winding.

16. The sensing arrangement structured to sense current or voltage of at least one conductor, the sensing arrangement comprising:
at least one wire wound resistor arrangement comprising:
a plurality of wire wound resistors electrically connected in a series connection;
a first terminal disposed at a first end of the series connection of wire wound resistors; and
a second terminal disposed at a second end of the series connection of wire wound resistors,
wherein the wire wound resistors are arranged in a polygonal shape having at least three vertices, and
wherein the first terminal and the second terminal are disposed at one of the vertices; and
a measurement unit electrically connected to at least one of the first and second terminals of said at least one wire wound resistor arrangement, and
wherein the wire wound resistor arrangement is structured to allow the conductor to pass through an interior of the polygonal shape,
wherein the measurement unit is structured to determine the current or voltage of the conductor based on an output of at least one of the first and second terminals of said at least one wire wound resistor arrangement, and
wherein the at least one conductor is two conductors; wherein the at least one wire wound resistor arrangement is two wire wound resistor arrangements respectively corresponding to the two conductors; wherein the two wire wound resistor arrangements are electrically connected to the two conductors, respectively; wherein the second terminals of the two wire wound resistor arrangements are electrically connected to the measurement unit; and wherein the measurement unit is structured to determine the current of the two conductors and a voltage difference between the two conductors based on outputs of the second terminals of the two wire wound resistor arrangements.

17. The sensing arrangement of claim 16, wherein each of the two wire wound resistor arrangements are electrically connected to a corresponding one of the two conductors by an electrical connection at a vertex of the polygonal shape and a point on the corresponding one of the two conductors.

18. The sensing arrangement of claim 16, wherein the two conductors are line and neutral conductors, respectively.

19. The sensing arrangement of claim 16, wherein the polygonal shape is at least one of a triangle, a square, and a hexagon.

20. The sensing arrangement of claim 16, wherein each of the wire wound resistors includes a core and a wire wound around the core, and wherein the wire is composed of at least one of copper alloys, silver alloys, nickel chromium alloys, iron chromium allows, and iron chromium aluminum alloys; and wherein the core is composed of at least one of ceramic, plastic, and glass.

* * * * *